United States Patent [19]

Martinez et al.

[11] 4,273,395
[45] Jun. 16, 1981

[54] ADJUSTABLE BOX

[76] Inventors: John Martinez; Lilla V. Britt, both of 1646 East 2nd St., Brooklyn, N.Y. 11230

[21] Appl. No.: 58,494

[22] Filed: Jul. 18, 1979

[51] Int. Cl.³ .............................................. A47B 45/00
[52] U.S. Cl. .................................. 312/205; 312/7 R; 312/257 R
[58] Field of Search .................... 248/172, 7; 312/205, 312/257 R, 258, 263, 330, 140

[56] References Cited
U.S. PATENT DOCUMENTS

| | | | |
|---|---|---|---|
| 1,664,465 | 4/1928 | Purchas | 312/205 |
| 2,398,299 | 4/1946 | Frandsen | 312/205 |
| 2,664,258 | 12/1953 | Lanier | 312/205 |

Primary Examiner—Casmir A. Nunberg
Attorney, Agent, or Firm—Friedman, Goodman & Teitelbaum

[57] ABSTRACT

A slidably adjustable, readily assemblable box having a slidably expandable base portion, front corner member posts and rear corner member posts. The front corner member posts and rear corner member posts each have portions defining relatively perpendicular slots therebetween. The front and rear corner member posts are secured to the base portion. Detachable front corner members engage the front corner member posts in their perpendicular slots. Detachable rear corner members engaging the rear corner member posts in their perpendicular slots. A detachable, slidably expandable front wall panel pivotally engages the front corner members. A detachable, slidably expandable rear wall panel engages the rear corner members. Detachable side walls engage the front and rear corner members. The front wall panel and the rear wall panel have a slidable length relatively equal to the slidable length of the base portion.

9 Claims, 8 Drawing Figures

ADJUSTABLE BOX

BACKGROUND OF THE INVENTION

This invention relates generally to a high-fidelity component accessory unit, and more particularly to an expandable housing unit which is utilized by placing within it a component of the high-fidelity system. The unit is easy to assemble and can also be easily disassembled for storage or shipping purposes and re-assembled thereafter.

Many high-fidelity component systems for home entertainment purposes include several expensive components such as the tuner, amplifier, pre-amplifier and/or receiver. The electronic sections of these components are generally housed within a decorative frame which contains several control switches and dials. The decorative frame does not protect these controls, switches and dials from accidental movement. In addition, the terminals to which various wires which interconnect the components are secured are themselves exposed to room dirt and dust.

Because of their relative degree of technical sophistication and the cost of acquiring such high fidelity component systems, it is advantageous to provide protection to the components from dust, dirt, smoke and accidental movement of their controls. Currently, although there are dozens of brand name components on the market, costing anywhere from hundreds to thousands of dollars each, there are apparently no protective structures within which they can be placed and used in operation, where there would be provided protection from particles in the air and inadvertent movement of the controls.

It is desirable to provide a box-like structure which can be adjusted in width to enable the user to place within it any component desired, regardless of its relative size. Such a structure should be easy to assemble and use, as well as provide easy access to the controls and electrical connections of the component.

There have been several efforts made in the past to provide adjustable cabinets for television or radio sets. For example, Troutman Expansible Cabinet, U.S. Pat. No. 2,643,083 discloses an expansible cabinet which is adjustable in width. The Lanier patent, U.S. Pat. No. 2,664,258, also provides an adjustable cabinet base for a television or radio.

However, there has not been provided in the prior art an adjustable component box which contains front and rear panels which provide access to the component's control and terminals. Neither has there been provided such an adjustable box containing access panels which can also expand laterally as the box is expanded and still, in any expanded position, provide access to the controls of the component within.

SUMMARY OF THE INVENTION

Accordingly, it is an object of the present invention to provide an expandable box which avoids the aforementioned problems of the prior art. Another object of the present invention is to provide an expandable box which can easily be slidably adjusted to the dimensions required for use in conjunction with a high fidelity component of choice.

Yet another object of the present invention is to provide an expandable box which is easily adjustable by the general public. Still another object of the present invention is to provide an expandable box which can be shipped "knocked down" and then assembled by the purchaser. A further object of the present invention is to provide an expandable box which is readily assemblable and provides both front and rear access to the component within.

Briefly, the invention provides for readily assemblable complementary base portions which are slidable relative to each other and thereby adjustable in length. There are provided at the front and rear corner portions of the base several corner member support posts. Front and rear corner members are further provided for engagement with these support posts. The corner members are detachable components and are removably secured to the support posts. The front and rear corner members are provided with slots for slidable engagement with complentary side wall portions of an adjustable box. These side wall portions engage the corner member slots at their side edges. The front corner members have at their front wall portion a pivotally mounted member. A slidable front panel is provided. This front panel is comprised of sections which are slidable relative to each other and further provided with outer edge portions which engage the pivotally mounted member of the front corner member. The front panel is thereby pivotally mounted, providing access to the interior of the box.

An adjustable rear wall panel is provided. This rear wall panel is also comprised of slidable sections which expand laterally. Each slidable section is further provided with another slidable portion which slides along an axis relatively perpendicular to the lateral expansion axis. This arrangement provides access to the rear panel of the components within the box regardless of the relative expansion of the box.

A top portion is further provided. This portion also contains sections slidable relative to each other and the top functions as an expandable portion of the box.

The relative lenghts of expansion of the front and rear panels and the base and top portions are the same.

BRIEF DESCRIPTION OF THE DRAWINGS

With the above and additional objects and advantages in view, as will hereinafter appear, this invention comprises the devices, combinations and arrangements of parts hereinafter described by way of example and illustrated in the accompanying drawings of a preferred embodiment in which.

In the various figures of the drawings, like reference characters designate like parts.

DETAILED DESCRIPTION OF THE PREFERRED EMBODIMENT

Figure 1:
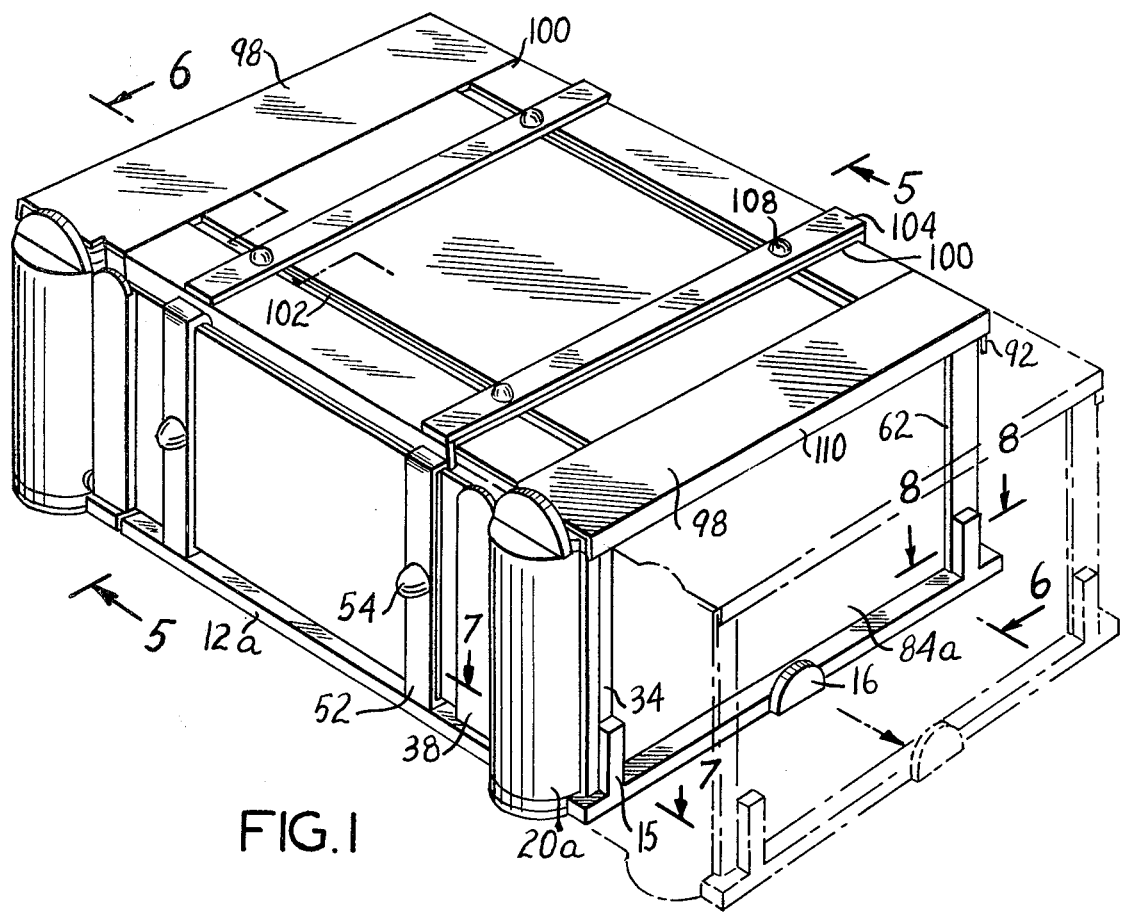
FIG. 1 is a perspective view of the adjustable box in accordance with the present invention.
Figure 2:
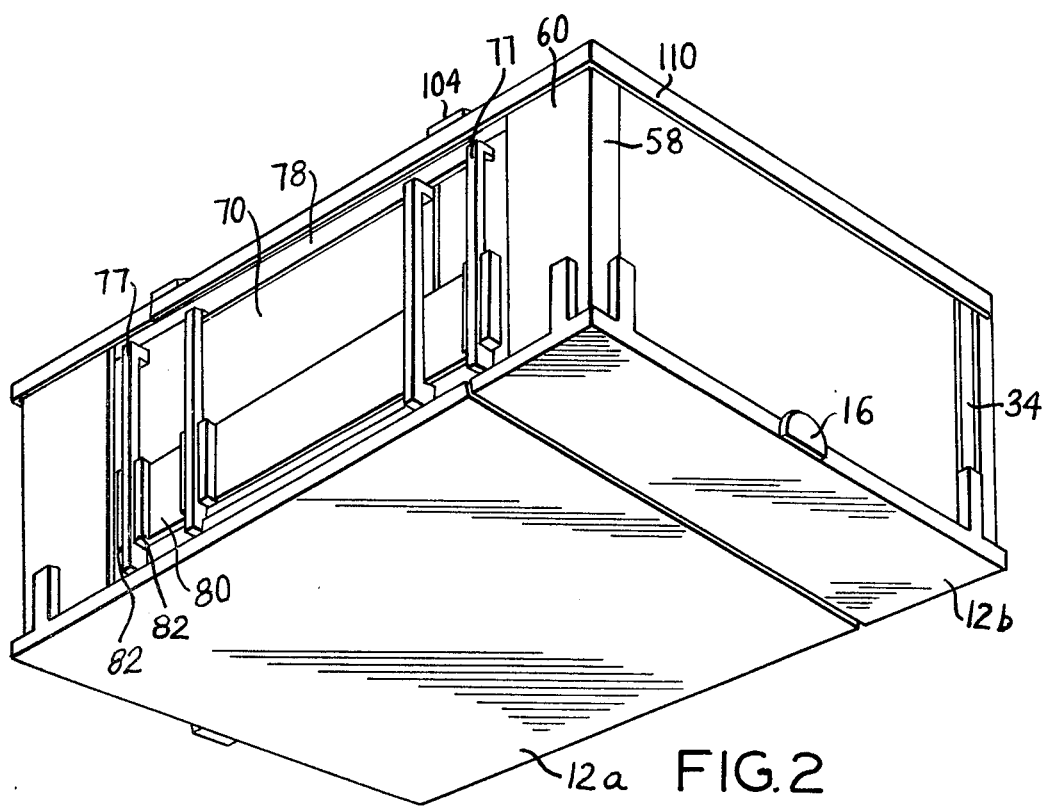
FIG. 2 is another perspective view of the adjustable box shown in FIG. 1, showing a bottom rear view thereof.

Referring now to FIGS. 1 and 2, the slidably adjustable box in accordance with the present invention is shown generally at 10 and includes a substantially flat, adjustable base 12. The base 12 has a generally rectangular configuration and is provided with corner support members 14. The base 12 is made from two slidably engageable cooperating platform sections 12a and 12b. These platform sections 12a, 12b are slidable relative each other along their lengthwise axis, so as to be adjustable in length. Through the sliding actions the platform sections 12a, 12b cooperate to form the adjustable base 12.

On the side edges of base 12 there are located a pair of oppositely disposed vertical side wall supports 16. These side wall supports 16 are situated on the edges of the outer sides of platform sections 12a, 12b to provide support for the side walls of the invention.

Figure 3:
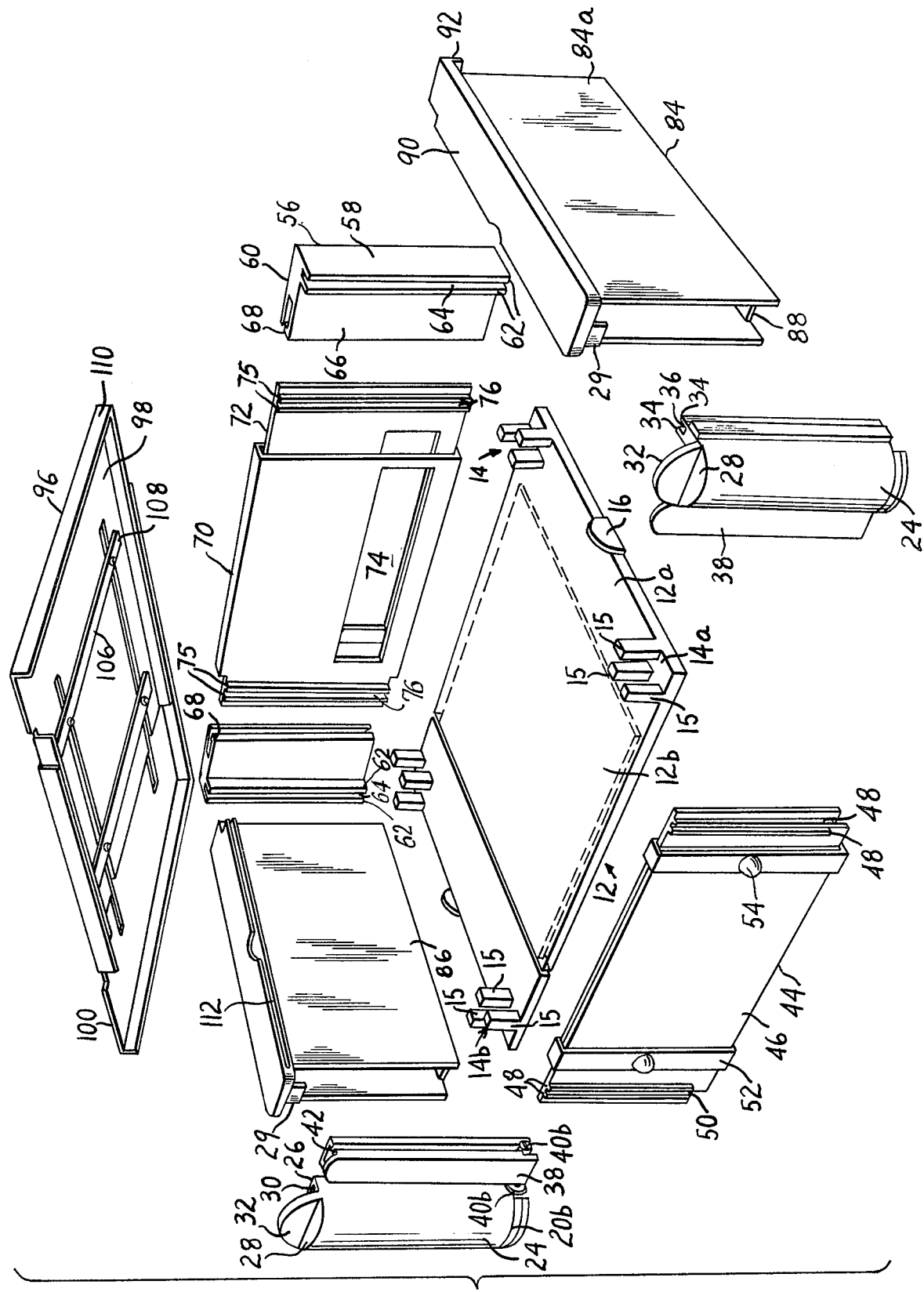
FIG. 3 is an exploded view of the adjustable box shown in FIG. 1, showing a top front view thereof.
Figure 7:
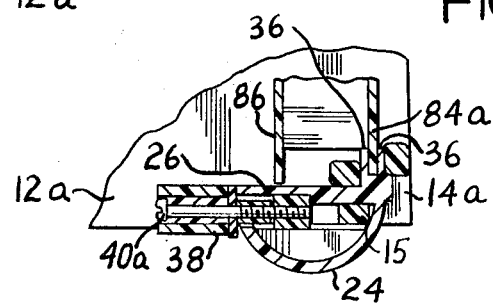
FIG. 7 is a sectional view taken along line 7—7 of FIG. 1.

The front corner support members 14a, 14b and rear corner support members 14 each have three individual posts 15 projecting vertically from base 12. As best seen in FIGS. 1, 3 and 7 front corner support members 14a, 14b engage front corner posts 20a, 20b. The front corner posts 20a, 20b are comprised of a relatively cylindrical front and side portion 24 and a vertical, flat rear wall portion 26. The base of the corner posts 20a, 20b are open, allowing posts 20a, 20b to be placed over the front corner support member post 15, which abuts the front edge of the base. A cover portion 28 is provided for each corner post 20a, 20b. The cover portions 28 are provided with elongated slots 30. These slots are designated for engagement with a downward, descending lip 29, which lip 29 is on the front top edge of the side wall portions 84, 86 of the adjustable box. In this preferred embodiment additional decorative discs 32 have been provided on the cover portions 28 of the front corner posts 20a, 20b.

As shown best in FIGS. 3, 7 rear wall portions 26a, 26b of the front corner members 20a, 20b enclose the arcuate front and side portions 24 of these corner posts 20a, 20b. There is provided on these rear wall portions 26a, 26b a pair of parallel ribs 34, defining slot 36, which projects rearward from these rear wall portions 26a, 26b. These ribs 34 are positioned adjacent the outer corner of the post 20a, 20b and are themselves in a spaced apart relationship where the distance between the outer faces of the parallel ribs is not wider than the space between the two corner support member posts 15 which are themselves parallel to the front edge of base 12. As best shown in FIG. 7 these two posts and the front edge post snugly engage the rear wall 26a, 26b, and projecting ribs 34 of corner posts 20a, 20b.

As best shown in FIGs. 3, 7 there is a front panel 38 pivotally mounted to corner posts 20a, 20b. In this preferred embodiment tension screws 40a, 40b are used to secure the pivotally mounted panel 38 to posts 20a, 20b. the pivot mount panel 38 is provided with parallel front and rear wall portions which terminate inwardly in vertical bar 42.

Figure 4:
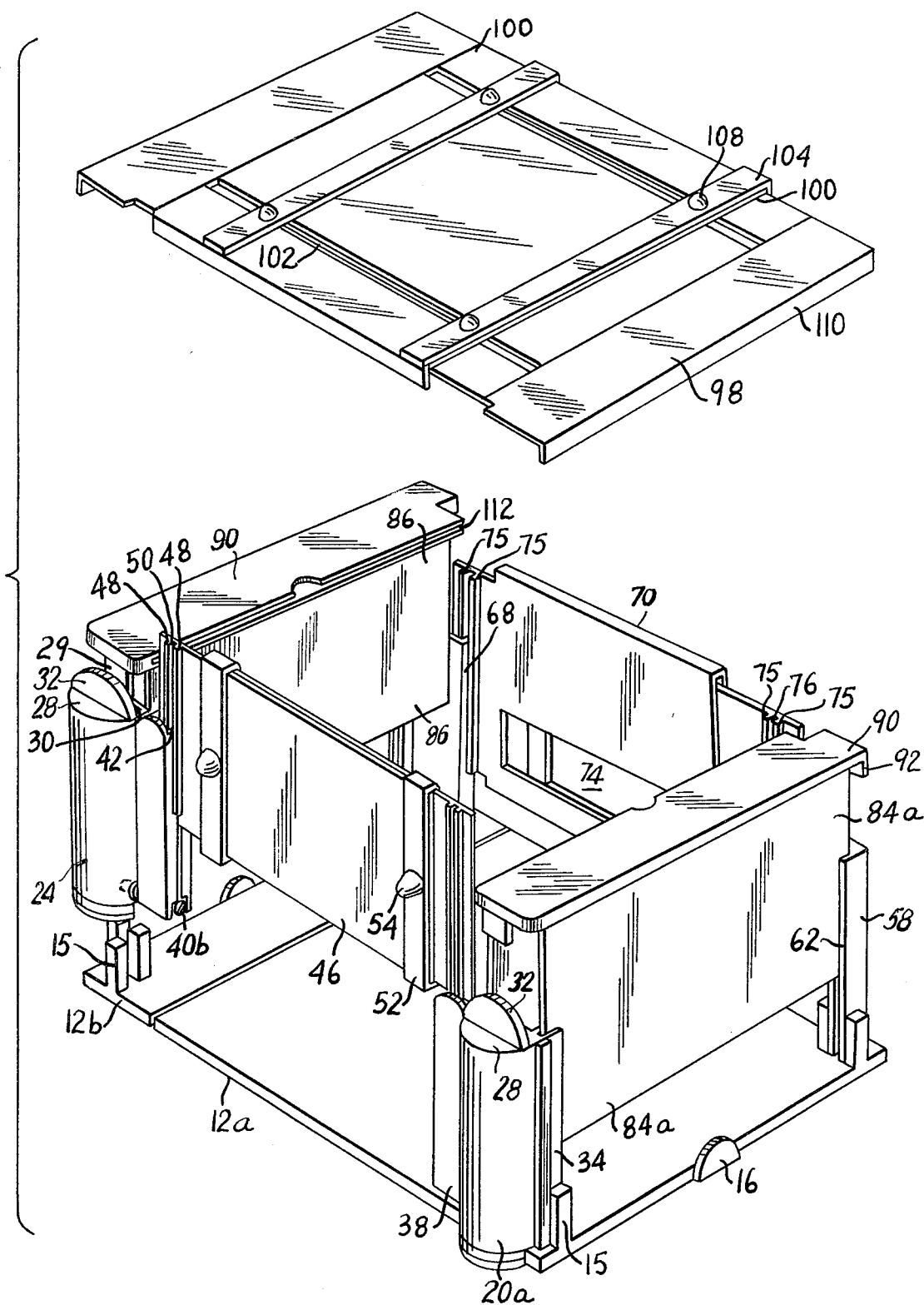
FIG. 4 is a front perspective view of the adjustable box showing the interconnection between the parts.

As best shown in FIGS. 3 and 4 an expandable front panel 44 is provided for engagement with the pivotally mounted panel 38. The front panel 44 includes complimentary rectangular shaped relatively slidable panels 46. Each panel 46 is further provided at its outer edge with parallel vertical rails 48 which are spaced apart to provide slot 50. This slot 50 engages a front vertical bar 42 of pivot panel 38.

The two slidable front panels 46 are secured to each other in a manner which provides for relatively slidable action. In the preferred embodiment cross-straps 52 are placed transversely around both outer faces of slidable panels 46 and fixedly secured to one side of each panel at an end of the panel 46 which is opposite the parallel rails 48 of that panel. In this preferred embodiment decorative dome-like projection 54 are secured to straps 52. These projections 54 can also function as handles to be used when adjusting the width of the box.

As best shown in FIG. 4 the front panels 46 are slidably attached to the pivot panel 38 after the engagement of parallel rails 48 of the front panels 46 with vertical bars 42 of the pivot panel 38.

Figure 5:
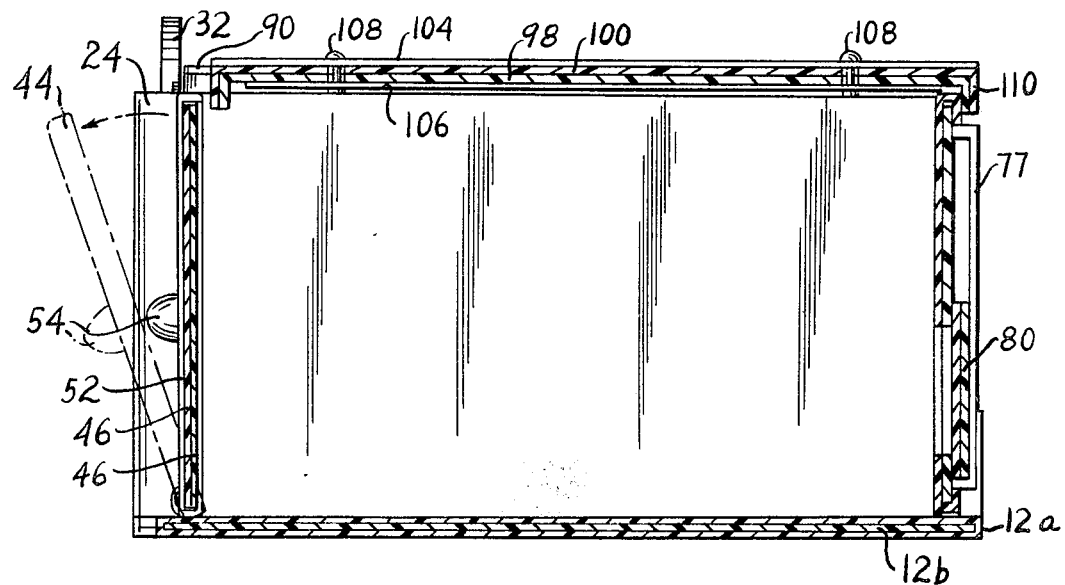
FIG. 5 is a sectional view taken along line 5—5 of FIG. 1.

As best shown in FIGS. 4 and 5 the front panel 44 can pivot outward at any panel length, because the expandable sliding action of the panels 46 is independent of the pivotal action of panel 38. This arrangement results in easy access to the interior of box 10 at all its adjustable lengths.

Figure 8:
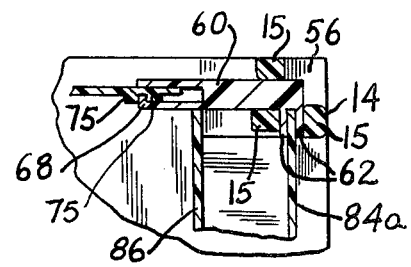
FIG. 8 is a sectional view taken along line 8—8 of FIG. 1.

As best shown in FIGS. 3, 4 and 8 rear corner members 56 engage the rear corner supports 14. The rear corner members are constructed of two relatively perpendicular portions; a side portion 58 and a rear portion 60. Side portion 58 is constructed of two vertical parallel projecting ribs 62 which define a channel 64 therebetween. The relatively perpendicular rear portion 60 contains front and rear spaced apart vertical walls 66. A single, vertical rail 68 is secured to the inner vertical wall 66 at the end furthest from the corner supports 14.

As best shown in FIG. 8 the three posts 15 of each corner support 14 are arranged in each base corner at points which define the corners of a right triangle, with the right angle corner of the triangle diagonally opposite the respective corner of base 12. This causes the axis of the adjoining walls of the corner members to remain perpendicular to each other when engaged with posts 15. By carefully selecting the space between the posts of the corner support members 14 and the width of the walls of the front and rear corner members these corner members can be snugly attached to the corner support members on the base yet easily removed for storage and shipping.

As best shown in FIGS. 2, 3 and 4 a slidably expandable rear panel section is shown generally at 70. This section will provide access to the rear of the component within the box. The rear panel 70 is comprised generally of a slidable pair of sections 72 which are slidable relative to each other so as to be adjustable in length. Each slidable section 72 is provided with a portion defining a rectangular opening 74 therethrough. These openings 74 are preferably of relatively equal dimension and overlap when the slidable sections 72 are in their maximum overlap or closed position. It is through these openings that access to the inside rear of the adjustable box is provided.

The front panel 44 and rear panel 70 are constructed to provide the same relative slidable length when each panel is in the closed position as shown in FIG. 1 as well as when in an open, expanded position, also shown in FIG. 1.

At one outer edge of each panel 72 there are provided two vertical parallel rails 75 which define vertical slot 76 therebetween. The rails 75 are positioned so that the slot 76 they define is proportioned to snugly accept within it rail 68 of corner members 56.

As best shown in FIG. 2, on the outside face of rear panel 72 additional parallel rails 77 are provided on both sides of the rectangular opening 74. Upper and lower projecting strips 78 are positioned on the upper and lower edges of the inner rear panel 72 and partially bracketing the outer panel 72. These strips 78 maintain the two rear panels 72 in a close, slidable relationship to each other.

The rear panel openings 74 are required for access to the rear portions of the component within the expandable box. Although the rear slidable panels 72 could be pivotally mounted it is more convenient to slidably mount them because it requires less space between the rear of the box and any wall it may be placed near than would be required if the rear panel were to pivot open.

As best shown in FIG. 2, slidable covers 80 are provided to cover the openings 74 in rear panels 72. The covers 80 are mounted by providing parallel-vertical bars 82 on the outer surface of each end of cover 80. These vertical bars 82 engage vertical rails 77 in a slidable relationship. There is only one pair of parallel vertical bars 82 provided on cover 80 of outer panel 72 in order to provide for relative vertical, sliding movement between inner and outer covers 80.

In order to assemble the adjustable box 10 it is necessary to insert the front corner members 20a, 20b, including pivot panel 38, and rear corner members 56, into the perpendicular slots defined by the individual posts 15 of corner support members 14. The front 44 and rear 70 adjustable panels are then inserted into these corner members. The side walls 84 are then inserted into grooves 36 and 64 of the front 20, 20a and rear 56 corner members.

The side wall 84 of the preferred embodiment is constructed with an outer wall 84a and opposed parallel inner wall 86. The side wall is further provided with a base 88 and cover 90. As best shown in FIG. 3 the rear edge of cover portion 90 is provided with a descending lip portion 92. The front underside of cover 90 is provided with a transverse descending ridge portion 94. Outer wall 84a, is inserted into both slot 36 of front corner members 20a, 20b and slot 64 of rear corner members 56. Transverse descending ridge 94 snugly engages slot 30 of the front corner member and descending lip 92, at the rear edge of the side wall, abuttingly engages the outside upper rear wall of corner member 56.

When the front expandable panel 44 and rear expandable panel 70 are attached respectively to the front pivot panels 38 and the rear corner members 56, the front and rear walls of the box, as well as the base 12, will be slidably expandable together. At each position obtained when sliding the box open or closed the user will have access to the front and rear of the box through the adjustable panels.

As best shown in FIGS. 1, 3 and 4, the box can be provided with an adjustable box cover 96 having upper and lower section 100 slidable relative each other. A pair of elongated, opposed parallel openings 102 is provided in each slidable section. These elongated openings 102 are disposed in a corresponding position on each slidable section so that they are in a superimposed position when the upper and lower sections are overlapped. An upper tie strap 104 and lower tie strap 106 are positioned transverse each section. The upper strap 104 is transverse the inner edge of the upper slidable section 100 and is fixedly secured to that edge. The lower tie strap 106 is secured to upper tie strap 104 by conventional means such as bolts 108. Similarly, transverse tie strap 106 is fixedly secured to the inner edge of the lower slidable section 98 and its complimentary upper tie strap 104 is secured to it by bolt means 108. The bolts 108 secure the upper and lower tie straps to each other, yet provide sufficient slackness for the upper and lower slidable sections to be slidably adjustable. Box cover 96 is also provided with a side and rear descending lip 110, which engages both the sidewalls 84 and rear of the adjustable box.

The relative length of the portions of the top sections which slide relative each other is the same as that of the relative length of the front 44, rear 70 and base 12 expandable panels which slide relative each other.

As shown most clearly in FIGS. 3 and 4, a slot portion 112 is provided on the inner edges of top portion 90 of the side walls 84 of the adjustable box. This provides for an alternate embodiment of a cover member, not shown, to be inserted into the slots 112 after the box is adjusted to the desired length.

FIG. 5 is a sectional view which shows more clearly the interrelationships between the front, rear, top and bottom slidable components.

Figure 6:
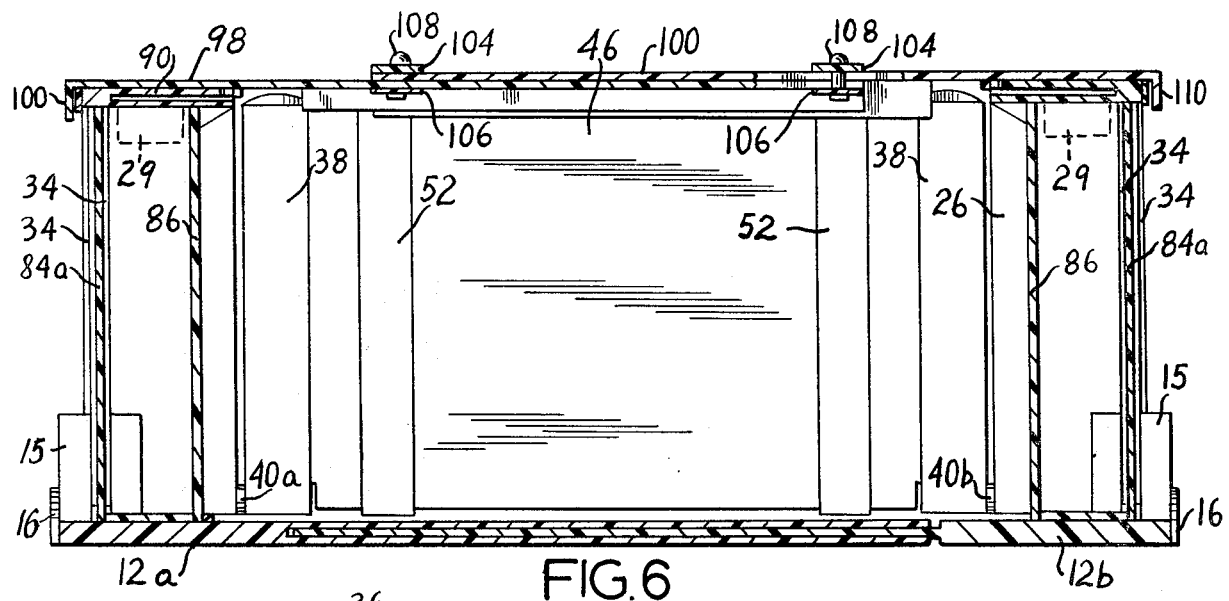
FIG. 6 is a sectional view taken along line 6—6 of FIG. 1.

FIG. 6 is a sectional view looking to the front of the adjustable box. As is clearly shown in this figure the front corner members 14a, 14b snugly abut against the side wall 84a of the box.

FIG. 7 shows the relationship of the front corner support member 14a in engagment with the front corner post 20a. In addition, side wall 84 and front pivot member 38 are shown in engagement with the front corner member 20a.

FIG. 8 is a sectional view which shows a rear corner member 56 which is engaged with the rear corner support member 14. The parallel rails 75 of rear panel 72 are shown in engagment with vertical rail 68 of the corner member.

In the preferred embodiment the components of the expandable box have been made from plastic. This choice is merely one of design and the invention could be made from wood, metal or the like and still be expansible, readily assemblable and relatively lightweight.

What is claimed is:

1. A slidably adjustable, readily assemblable box comprising:
   a slidably expandable base portion;
   front corner member posts and rear corner member posts, said front corner member posts and rear corner member posts each having portions defining relatively perpendicular slots therebetween;
   means for securing said front and rear corner member posts to said base portion;
   front corner members engaging said front corner member posts in their perpendicular slots, and rear corner members engaging said rear corner member posts in their perpendicular slots;
   a slidably expandable front wall panel, and means for pivotally engaging said slidably expandable front wall panel to said front corner members;
   a slidably expandable rear wall panel, and means for engaging said rear wall panel to said rear corner members;
   side wall members, and means for engaging said side wall members to said front and rear corner members;
   said front wall panel and said rear wall panel having a slidable length relatively equal to a slidable length of said base portion;

said means for engaging said side walls of the box to said front and rear corner members including complimentary engaging slot portions on a side edge portion of said front corner members and on a side edge portion of said rear corner members, said slot portions snugly engaging vertical edges of said side walls; and transverse slots being provided on cover portions of said corner members, said transverse slots engaging downwardly projecting lip portions provided on said side wall members, and descending lip portions provided on rear edges of said side walls, and snugly abutting against rear wall sections of said rear corner members.

2. A slidably adjustable, readily assemblable box comprising:

a slidably expandable base portion;

front corner member posts and rear corner member posts, said front corner member posts and rear corner member posts each having portions defining relatively perpendicular slots therebetween;

means for securing said front and rear corner member posts to said base portion;

front corner members engaging said front corner member posts in their perpendicular slots, and rear corner members engaging said rear corner member posts in their perpendicular slots;

a slidably expandable front wall panel, and means for pivotally engaging said slidably expandable front wall panel to said front corner members;

a slidably expandable rear wall panel, and means for engaging said rear wall panel to said rear corner members;

side wall members, and means for engaging said side wall members to said front and rear corner members;

said front wall panel and said rear wall panel having a slidable length relatively equal to a slidable length of said base portion; and said slidable front panel including front and rear portions slidable relative to each other, and means for slidably securing said front and rear portions to each other including strap-like members disposed transversely around outer faces of said front and rear portions, one strap-like member being fixedly secured to said front portion and another strap-like member being fixedly secured to said rear portion to permit sliding movement between said front and rear portions.

3. A slidably adjustable, readily assemblable box comprising:

a slidably expandable base portion;

front corner member posts and rear corner member posts, said front corner member posts and rear corner member posts having portions defining relatively perpendicular slots therebetween;

means for securing said front and rear corner member posts to said base portion;

front corner members engaging said front corner member posts in their perpendicular slots, and rear corner members engaging said rear corner member posts in their perpendicular slots;

a slidably expandable front wall panel, and means for pivotally engaging said slidably expandable front wall panel to said front corner members;

a slidably expandable rear wall panel, and means for engaging said rear wall panel to said rear corner members;

side wall members, and means for engaging said side wall members to said front and rear corner members;

said front wall panel and said rear wall panel having a slidable length relatively equal to a slidable length of said base portion;

said expandable rear wall panel including an inner slidable panel and an outer slidable panel, said inner and outer panels each having means for detachably engaging a rear wall section of an associated rear corner member, means for slidably engaging said inner and outer panels to each other, said inner and outer panels each having portions defining a rectangular opening; and a cover member slidably disposed on each rectangular opening of each inner and outer panel.

4. A slidably adjustable, readily assemblable box comprising:

a slidably expandable base portion;

front corner member posts and rear corner member posts, said front corner member posts and rear corner member posts each having portions defining relatively perpendicular slots therebetween;

means for securing said front and rear corner member posts to said base portion;

front corner members engaging said front corner member posts in their perpendicular slots, and rear corner members engaging said rear corner member posts in their perpendicular slots;

a slidably expandable front wall panel, and means for pivotally engaging said slidably expandable front wall panel to said front corner members;

a slidably expandable rear wall panel, and means for engaging said rear wall panel to said rear corner members;

side wall members, and means for engaging said side wall members to said front and rear corner members;

said front wall panel and said rear wall panel having a slidable length relatively equal to a slidable length of said base portion;

a cover having an upper slidable portion and a lower slidable portion;

said upper and lower slidable portions being provided with complimentary longitudinal slots, and sets of upper and lower transverse strap-like members disposed relatively perpendicular to said longitudinal slots and disposed at opposite end portions of said upper and lower slidable portions; and means extending through said longitudinal slots for securing each set of said upper and lower strap-like members to each other, one set of strap-like members being fixedly secured to said upper slidable portion and another set of strap-like members being fixedly secured to said lower slidable portion to permit slidable movement between said upper and lower portions along said longitudinal slots.

5. A slidably adjustable, readily assemblable box comprising:

a slidably expandable base portion;

front corner member posts and rear corner member posts, said front corner member posts and rear corner member posts each having portions defining relatively perpendicular slots therebetween;

means for securing said front and rear corner member posts to said base portion;

front corner members engaging said front corner member posts in their perpendicular slots, and rear corner members engaging said rear corner member posts in their perpendicular slots;

a slidably expandable front wall panel, and means for pivotally engaging said slidably expandable front wall panel to said front corner members;

a slidably expandable rear wall panel, and means for engaging said rear wall panel to said rear corner members;

side wall members, and means for engaging said side wall members to said front and rear corner members;

said front wall panel and said rear wall panel having a slidable length relatively equal to a slidable length of said base portion; and said front and rear corner member posts including sets of relatively perpendicular projecting portions on said base portion, each set of said projecting portions defining an apex of a right triangle relative to two substantially perpendicular slots disposed between said projection portions of each set.

6. A box as in claim 5 further comprising a slidably expandable cover portion having an upper and a lower slidable portion, means for slidably securing said upper and lower portions to each other, said upper and lower portions having a slidable length relatively the same as the slidable length of said base portion.

7. A box as in claim 5, where in each of said rear corner members is further provided with a rear wall section having means for detachably engaging said rear wall panel member.

8. A box as in claim 5, wherein said slidable front panel includes front and rear portions slidable relative to each other, and means for slidably securing said front and rear portions to each other.

9. A slidably adjustable, readily assemblable box comprising:

a slidably expandable base portion;

front corner member posts and rear corner member posts, said front corner member posts and rear corner member posts each having portions defining relatively perpendicular slots therebetween;

means for securing said front and rear corner member posts to said base portion;

front corner members engaging said front corner member posts in their perpendicular slots, and rear corner members engaging said rear corner member posts in their perpendicular slots;

a slidably expandable front wall panel, and means for pivotally engaging said slidably expandable front wall panel to said front corner members;

a slidably expandable rear wall panel, and means for engaging said rear wall panel to said rear corner members;

side wall members, and means for engaging said side wall members to said front and rear corner members;

said slidably expandable base portion having complimentary tongue and groove portions;

said front corner members having a side edge portion provided with slot portions, and said rear corner members having a side wall portion provided with a slot portion, said side wall members having an outer wall with edge portions engaging the front and rear corner member slot portions;

said side wall member further having a top portion provided with front and rear descending transverse lip portions, said front descending lip portion engaging a complimentary slot portion in the front corner members, and said rear descending lip portion abutting against a rear wall portion of said rear corner member;

said slidably expandable front wall panel having front and rear wall portions slidable relative to each other, said front and rear wall portions being slidably secured by strap-like members disposed transversely around outer faces of said front and rear wall portions, one strap-like member being fixedly secured to said front wall portion and another strap-like member being fixedly secured to said rear wall portion, said front and rear wall portions each having portions defining vertical grooves at their outer edges, said vertical grooves engaging a vertical bar disposed on a front pivotally mounted panel, said pivotally mounted panel being pivotally secured to said front corner members by means of pivot screws;

said slidably expandable rear wall panel having an inner slidable panel and an outer slidable panel having portions defining vertical grooves at their outer edges, said inner and outer slidable panels being provided with rectangular openings having slidable cover members;

a box cover having an upper and a lower slidable portion slidably secured to each other by upper transverse strap-like members and lower transverse strap-like members; and said front wall panel, said rear wall panel and said cover having a slidable length relatively equal to a slidable length of said base portion.

* * * * *